(12) United States Patent
Pfefferlein

(10) Patent No.: US 10,966,337 B2
(45) Date of Patent: Mar. 30, 2021

(54) ELECTRICAL CONVERTER

(71) Applicant: Siemens Aktiengesellschaft, Munich (DE)

(72) Inventor: Stefan Pfefferlein, Heroldsberg (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 16/649,644

(22) PCT Filed: Sep. 28, 2018

(86) PCT No.: PCT/EP2018/076497
§ 371 (c)(1),
(2) Date: Mar. 21, 2020

(87) PCT Pub. No.: WO2019/063805
PCT Pub. Date: Apr. 4, 2019

(65) Prior Publication Data
US 2020/0275574 A1    Aug. 27, 2020

(30) Foreign Application Priority Data
Sep. 29, 2017  (EP) .................................... 17194129

(51) Int. Cl.
*H05K 7/14*     (2006.01)
(52) U.S. Cl.
CPC ........... *H05K 7/1471* (2013.01); *H05K 7/142* (2013.01); *H05K 7/1432* (2013.01)
(58) Field of Classification Search
CPC ..... H05K 7/1471; H05K 7/142; H05K 7/1432
See application file for complete search history.

(56) References Cited

U.S. PATENT DOCUMENTS 6,324,057 B1    11/2001  Baran et al.
2013/0120946 A1  5/2013  Busse et al.
(Continued)

FOREIGN PATENT DOCUMENTS

EP        2833404 A1     2/2015
WO    WO 2013172183 A1  11/2013

OTHER PUBLICATIONS

PCT International Preliminary Examination Report and Written Opinion of International Examination Authority dated Dec. 16, 2019 corresponding to PCT International Application No. PCT/EP2018076497 filed Sep. 28, 2018.

*Primary Examiner* — Abhishek M Rathod
(74) *Attorney, Agent, or Firm* — Henry M. Feiereisen LLC

(57) ABSTRACT

An electrical converter having pluggable converter components includes a first electronic assembly having electronic parts an assembly carrier, a housing chassis and a housing cover, wherein at least one of the electronic parts is a power semiconductor switch having a wide band gap and made of GaN or of InGaN. The power semiconductor switch is operated with a reverse bias of at least 400 V and at a clock frequency of at least 40 kHz during operation of the electrical converter. The first electronic assembly is mechanically plugged into the assembly carrier by connecting elements, and the first electronic assembly together with the assembly carrier is mechanically plugged and locked by further connecting elements to the housing chassis or to the housing cover using corresponding locking elements on the housing chassis or to the housing cover, respectively.

16 Claims, 4 Drawing Sheets

(56) References Cited

U.S. PATENT DOCUMENTS

| | | | |
|---|---|---|---|
| 2014/0346659 A1* | 11/2014 | Nakamura | H01L 23/043 257/704 |
| 2016/0192495 A1* | 6/2016 | Nakamura | H01L 23/5385 361/783 |
| 2018/0062539 A1* | 3/2018 | Singh | G01R 15/18 |
| 2018/0206359 A1* | 7/2018 | McPherson | H02M 3/158 |

* cited by examiner

ELECTRICAL CONVERTER

CROSS-REFERENCES TO RELATED APPLICATIONS

This application is the U.S. National Stage of International Application No. PCT/EP2018/076497 filed Sep. 28, 2018, which designated the United States and has been published as International Publication No. WO 2019/063805 A1 and which claims the priority of European Patent Application, Serial No. 17194129.7, filed Sep. 29, 2017, pursuant to 35 U.S.C. 119(a)-(d).

BACKGROUND OF THE INVENTION

The invention relates to an electrical converter for the operation of intermateable converter components with a first electronic module with electronic components, a module frame, an enclosure chassis and an enclosure lid.

Electrical or electronic converter components of electrical converters, such as for example electronic modules in the form of printed circuit boards with electronic components, module frames for accommodating the electronic modules and enclosure chassis and enclosure lids of the electrical converter are generally mechanically interconnected by force-locking connecting means during assembly of the electrical converter.

Such force-locking connecting means are for example screws for mechanically detachable connections or also rivets for mechanically nondetachable connections. These force-locking connecting means, which often consist of metallic materials, are also used in today's electrical converters because in particular the module frames, the enclosure chassis and optionally also the enclosure lid of these electrical converters either are part of solid metallic heat sinks for dissipating heat from the electronic components, in particular for dissipating heat from power semiconductor switches or from modules with power semiconductor switches, or are even in their entirety metallic heat sinks.

This is in particular also the case if for example conventional (Si or SIC) IGBT power semiconductor switches are operated in service with high blocking voltages, for example of greater than 400 V, high clock frequencies, for example of greater than 40 kHz, and with switching currents of for example greater than 7 A.

These converter components, which substantially constitute the heavy metallic materials, are generally designed with regard to such force-locking connecting means for high loading of their mechanical connections.

Furthermore, for reasons of reducing costs in the production process or materials usage, material-bonded connection technologies, such as for example adhesive bonding, soldering or other mainly mechanically nondetachable connection technologies, are also being used.

This may be of assistance in terms of the structure and assembly of compact electrical converters with regard to the functional integration of their converter components, material savings and reduction of steps in the production process, since it is in this case possible very largely to dispense with detachable mechanical connections and the associated space and material requirements. However, using such material-bonded connection technologies in particular prevents rapid and nondestructive disassembly of the converter components during maintenance and repair activities.

Another aspect to be taken into consideration with connection technologies for electrical converters are the efforts made by manufacturers to preassemble electronic modules on the module frame, for example with screwed connections, and to enclose this preassembled combination of the stated converter components with enclosure elements of the electrical converter and then likewise fasten these elements, for example by means of screwed connections.

This method of construction often results in tolerance problems, however. The enclosure elements here have to be assembled from different joining directions and be oriented to one another within tight tolerance limits in order, for example, to meet the necessary requirements with regard to IP protection classes (International Protection Codes) and EMC (electromagnetic compatibility).

Screwed connections, for example for mechanically connecting the module frame to electronic modules on the converter enclosure, also require sufficient installation space, which conflicts somewhat with a compact, space-saving structure of the electrical converter.

Another alternative approach to constructing electrical converters is, for example, tower construction of electronic modules, wherein the latter are placed on a mounting chassis or the enclosure chassis and often screwed in place. This structure of electronic module and mounting chassis or enclosure chassis is then surrounded or enclosed by an enclosure envelope or the enclosure lid and likewise usually mechanically connected by means of screwed connections.

This type of construction technology is often only suitable when the chassis does not have high walls since there is otherwise a risk of the electronic modules not being fitted within mechanical and electrical tolerances, which may in turn impair functioning of the electronic modules in operation.

Apart from applying to electrical converters for drive and power supply technology, these considerations also apply in principle to automation devices for further automation tasks, such as for example automation devices with programmable controllers (PLC) as well as actuators (control elements, valves etc.) and sensors (measuring transducers) for process automation which are not or not exclusively intended for drive and power supply solutions.

The problem addressed by the invention is therefore that of providing an electrical converter which, for mechanically connecting converter components such as the electronic module, module frame, enclosure chassis and enclosure lid, provides a connection technology which, while ensuring constant mechanical loading capacity, enables a more compact, installation space-saving structure of the electrical converter and further reduces the use of metallic materials with regard to these mechanical connections.

SUMMARY OF THE INVENTION

The problem is solved by an electrical converter for the operation of intermateable converter components, having a first electronic module with electronic components, a module frame, an enclosure chassis, and an enclosure lid, wherein at least one of the electronic components is a wide-bandgap GaN or InGaN power semiconductor switch and, when the electrical converter is in operation, the at least one power semiconductor switch is operated with a blocking voltage of at least 400 V, with a switching current of at least 7 A and with a clock frequency of at least 40 kHz, wherein the first electronic module is mechanically mated with the module frame by means of connecting elements, and wherein once intermated with the module frame, the first electronic module is mechanically mated and latched by means of further connecting elements to the enclosure chassis via latch elements of the enclosure chassis or to the enclosure lid via latch elements of the enclosure lid.

The Invention is accordingly based on the recognition that, with the introduction of high-bandwidth GaN or InGaN semiconductor switches which are in particular operated with high blocking voltages (>400 V) and high clock frequencies (>40 kHz) at switching currents of greater than 7 A, it is possible to dispense with or at least substantially reduce the space and material requirements for the previously used solid metallic heat sinks which until today have often been completely or at least partially integrated into enclosure chassis and/or enclosure lids of the electrical converters. This in turn opens up new options for connecting and arranging converter components in electrical converters.

The proposed solution to the problem involves an electrical converter for the operation of intermateable converter components comprising a first electronic module with electronic components, a module frame, an enclosure chassis and an enclosure lid, wherein at least one of the electronic components is a wide-bandgap GaN or InGaN power semiconductor switch and, when the electrical converter is in operation, the at least one power semiconductor switch is operated with a blocking voltage of at least 400 V and with a clock frequency of at least 40 kHz, wherein the first electronic module is mechanically mated with the module frame by means of connecting elements and wherein, once intermated with the module frame, the first electronic module is mechanically mated and latched by means of further connecting elements to the enclosure chassis via latch elements of the enclosure chassis or to the enclosure lid via latch elements of the enclosure lid.

When the electrical converter is in operation, the power semiconductor switch is in particular operated with a switching current of at least 7 A.

When using the at least one wide-bandgap GaN or InGaN power semiconductor switch as an electronic component, it is scarcely necessary any longer to use solid metallic heat sinks for dissipating heat from this power semiconductor switch even in the case of operation with relatively high blocking voltages (>400 V) and clock frequencies (>40 kHz) and in particular even a switching current of at least 7 A. These solid metallic heat sinks are generally bulky and heavy and usually serve as the central connection point of the electrical converter and for this reason therefore substantially restrict arrangement and connection options for other converter components.

Wide-bandgap GaN or InGaN power semiconductor switches may also be used in a bridge circuit in the electrical converter according to the invention, for example configured as six-pulse bridge circuits (B6 bridge) which accordingly have six semiconductor switches, wherein even in this case there is no need for solid metallic heat sinks, in contrast with comparable solutions for example using SIC power semiconductors. The at least one power semiconductor switch should thus here likewise be understood as a module with a plurality of semiconductor switches and for example configured as a bridge circuit.

By means of the connecting elements and latch elements of the electrical converter according to the invention, the intermateable converter components may advantageously be straightforwardly preassembled, closely nested and thus compactly and neatly constructed and also comparatively straightforwardly taken apart for maintenance purposes.

Furthermore, the connecting elements, together with the module frame and the latch elements of the enclosure chassis or of the enclosure lid, particularly advantageously provide the stability required for operation of the first electronic module.

Advantageous developments of the electrical converter are stated in the dependent claims.

In a first advantageous development of the electrical converter according to the invention, the first electronic module is mechanically mated directly by means of connecting elements and/or indirectly via the module frame by means of connecting elements with at least one further electronic module which has electronic components.

Since the further electronic module may be mechanically connected to the module frame not only directly via the connecting elements but also indirectly via the first electronic module and the connecting elements, the module frame in this form is no longer required as the sole and usually central connection point for connecting a plurality of electronic modules to one another and also to the enclosure chassis and/or enclosure lid. At the same time, however, its grouping functionality for the electronic modules, which increases the stability of the electrical converter, is retained.

In particular flexibility for arranging electronic modules in the electrical converter is accordingly increased which, depending on the electrical requirements placed on the electrical converter, enables a compact and nested structure with the narrowest of interspaces between the electronic modules. These interspaces are substantially determined by the electrical specifications for the operational reliability of the electrical converter, such as for example protection from electrical arcing or electrical creepage distances between conductors of the electronic components on the electronic modules, which conductors, in operation, carry current or voltage.

In a further advantageous development of the electrical converter according to the invention, the at least one further electronic module is mechanically mated and latched by means of further connecting elements to the enclosure chassis via latch elements of the enclosure chassis or to the enclosure lid via latch elements of the enclosure lid.

By means of the connecting elements, electronic modules may be intermated as required as intermateable converter components which may by way of example comprise the first electronic module, the module frame and the further electronic module.

Advantageously, after latching, the intermated electronic modules form a stable mechanical connection with the enclosure chassis or enclosure lid by means of the further connecting elements latched in the latch elements of the enclosure chassis or of the enclosure lid.

The process of latching the intermated electronic modules may proceed without any additional aids solely by application of force onto the intermated electronic modules. If required, this stable mechanical connection of the intermated electronic modules can be unlatched again and the structure of the electronic modules intermated by means of the connecting elements may thus be nondestructively undone. This advantageously assists the modular structure and the replaceability or adaptability appropriate to the circumstances of the electronic modules of the electrical converter.

In a further advantageous development of the electrical converter according to the invention, the further connecting elements each have a connecting head which is inserted and latched into a latch element indentation of in each case one of the latch elements.

These connecting heads are advantageously adapted with regard to their dimensions and shape to the respective latch element indentation in order, on the one hand, to produce an in each case stable mechanical connection between the further connecting element and associated latch element and, on the other hand, also to render this stable mechanical connection nondestructively detachable.

In a further advantageous development of the electrical converter according to the invention, the connecting heads of the further connecting elements and the latch element indentation of the latch elements in each case connected thereto have an at least partially formed spherical shape or the connecting heads of the further connecting elements and the latch element indentation of the latch elements in each case connected thereto have a rectangular shape or the connecting heads of the further connecting elements and the latch element indentation of the latch elements in each case connected thereto have a tapered shape or the connecting heads of the further connecting elements and the latch element indentation of the latch elements in each case connected thereto have a cylindrical shape.

While the rectangular shape of the connecting heads and of the latch element-indentations advantageously assists the stability of the mechanical connection of the further connecting elements with the respective latch element in the latched state, detaching the mechanical connection by unlatching the connecting heads from the respective latch element indentations is in particular advantageously facilitated by the at least partially formed spherical shape and also by the cylindrical shape of connecting heads and the latch element indentations. The tapered shape of the connecting heads and the latch element indentations is advantageous if the bearing face of the connecting heads in the latch element indentation is to be kept very small, for example in order to minimize transmission of mechanical vibration from the enclosure chassis or enclosure lid to the further connecting elements and thus to the electronic modules.

In a further advantageous development of the electrical converter according to the invention, the enclosure chassis or the enclosure lid has at least one guide rail by means of which at least one of the connecting heads is guidable to the respective latch element indentations.

The at least one guide rail in the enclosure chassis or in the enclosure lid offers the advantage that, not only on introduction of the connecting heads of further connecting elements into the respective latch element indentations of the latch elements but also on guiding them back out, it is very largely possible to avoid tilting and hence damage to the electronic modules assembled via their connecting elements.

In a further advantageous development of the electrical converter according to the invention, the latch elements are by themselves or jointly with the enclosure chassis or enclosure lid of mechanically mobile construction and the latch elements have a means for unlatching the respective further connecting element.

If the latch elements are by themselves of mobile construction, the advantage is obtained that the activities of latching and unlatching generate almost no mechanical loads for the enclosure chassis or enclosure lid.

If the latch element is of somewhat rigid construction in terms of common mobility with the enclosure chassis or enclosure lid, it is the material structure of the latch element and enclosure chassis or latch element and enclosure lid which determines how much overextension of the material is possible for latching or unlatching. The advantage then resides in the inexpensive construction of the latch element with regard to the design and production of this solution.

In a further advantageous development of the electrical converter according to the invention, the enclosure chassis and/or the enclosure lid has an opening for actuating the means for unlatching the respective further connecting element.

In a further advantageous development of the electrical converter according to the invention, the enclosure lid is mechanically mated and latched with the enclosure chassis.

This development advantageously continues the connection technology of mating/latching connections which has already proved itself for mechanically connecting the electronic modules to the enclosure chassis or enclosure lid. It may, for example, be further developed in such a manner that the interior volume of the electrical converter enclosed by the enclosure chassis and enclosure lid can be modified taking account of the number of electronic modules intermated in the interior of the electrical converter by means of a plurality of latching stages.

In a further advantageous development of the electrical converter according to the invention, the mechanical connection of the enclosure lid to the enclosure chassis is a screwless mechanical connection.

Screws have the disadvantage that, on the one hand, the necessary installation space must be kept in the electrical converter. On the other hand, the weight and cost factor due to the usually metallic nature of the screws is certainly of significance to manufacturers. Dispensing with screws, aside from the generally mandatory use of tools for undoing or tightening them, is therefore already an advantage for mechanically connecting the enclosure lid to the enclosure chassis.

In a further advantageous development of the electrical converter according to the invention, the connecting elements and the further connecting elements are made in a proportion of at least 95% from a nonmetallic material or completely from a nonmetallic material and the nonmetallic material is in particular a plastics material.

Dispensing with metallic materials for producing the connecting elements and further connecting elements is an advantage for the electrical converter for reasons of weight and cost. Vapor deposition of metals onto non-metals, for example for shielding reasons or for reasons of conducting signals via the connecting elements and/or the further connecting elements, is however likewise possible. Use of the metallic material may here amount to up to 5% of the corresponding total material use.

In a further advantageous development of the electrical converter according to the invention, the module frame is made in a proportion of at least 95% from a nonmetallic material or completely from a nonmetallic material and the nonmetallic material is in particular a plastics material.

Dispensing with metallic materials for producing the module frame is an advantage for the electrical converter for reasons of weight and cost. Vapor deposition of metals onto non-metals, for example for shielding reasons or for reasons of conducting signals via the module frame, is however likewise possible. Use of the metallic material may here amount to up to 5% of the corresponding total material use.

In a further advantageous development of the electrical converter according to the invention, the enclosure chassis and/or the enclosure lid are made in a proportion of at least 95% from a nonmetallic material or completely from a nonmetallic material and the nonmetallic material is in particular a plastics material.

Dispensing with metallic materials for producing the enclosure chassis and/or enclosure lid is an advantage for the electrical converter for reasons of weight and cost. Vapor deposition of metals onto non-metals, for example for shielding reasons or for reasons of conducting signals via the enclosure chassis and/or enclosure lid, is however likewise possible. Use of the metallic material may here amount to up to 5% of the corresponding total material use.

In a further advantageous development of the electrical converter according to the invention, the mechanical connections formed by means of the connecting elements and/or further connecting elements are screwless mechanical connections.

Screws have the disadvantage that, on the one hand, the necessary installation space must be kept in the electrical converter. On the other hand, the weight and cost factor due to the usually metallic nature of the screws is certainly of significance to manufacturers. Dispensing with screws, aside from the generally mandatory use of tools for undoing or tightening them, is therefore already an advantage for the mechanical connection which can be produced by means of the connecting elements and/or further connecting elements.

In a further advantageous development of the electrical converter according to the invention, when the electrical converter is in operation, the at least one power semiconductor switch is operated with a switching current of at least 7 A.

BRIEF DESCRIPTION OF THE DRAWING

The above-described characteristics, features and advantages of this invention and the manner in which these are achieved will become more clearly and distinctly comprehensible from the following description of the exemplary embodiments, which are explained in greater detail in connection with the figures, in which.

DETAILED DESCRIPTION OF PREFERRED EMBODIMENTS

Figure 1:
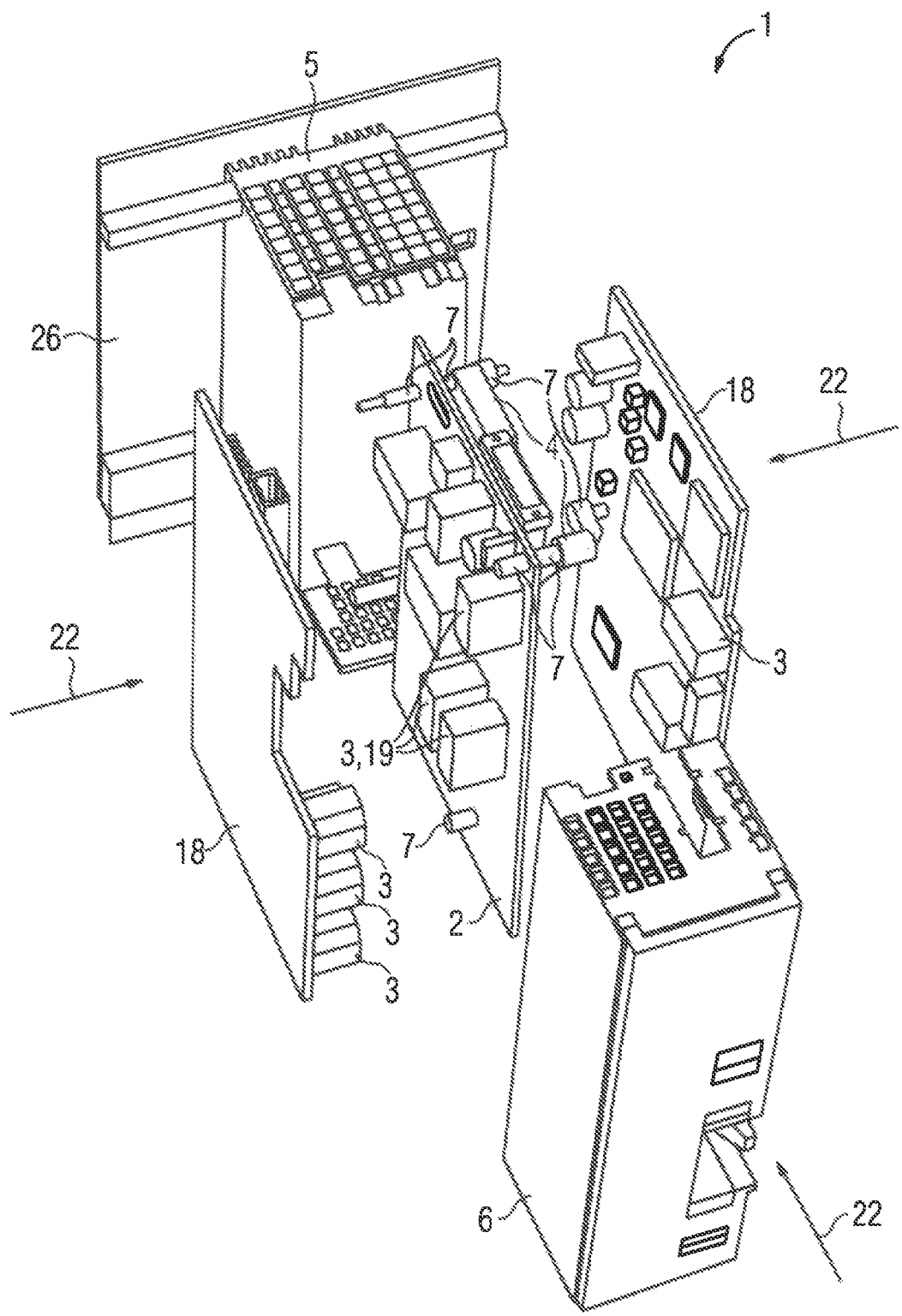
FIG. 1 shows a schematic exploded representation of the electrical converter according to the invention.

FIG. 1 shows a schematic exploded representation of the electrical converter 1 according to the invention.

By way of example, three wide-bandgap GaN or InGaN power semiconductor switches 19 as electronic components 3, in addition to other electronic components not specified in greater detail, are arranged on a first electronic module 2. These power semiconductor switches 19 may also be characteristic of power semiconductor switch modules with such semiconductor switches which for example take the form of six-pulse bridge circuits (B6 bridges). This first electronic module 2 may furthermore comprise a rectifier with the semiconductor switches 19 as infeed module and/or an inverter with the semiconductor switches 19 as load module of a frequency converter with DC link.

The first electronic module 2 comprises connecting elements 7 by means of which the first electronic module 2 is mechanically mated with the module frame 4. On the side of the module frame 4 remote from the first electronic module 2, connecting elements 7 are arranged on the module frame 4 by means of which a further electronic module 18 is connectable with the module frame 4. This further electronic module 18 may for example take the form of a control module which, in addition to further unspecified electronic components, has a control unit as electronic component 3.

The side of the first electronic module 2 on which the wide-bandgap GaN or InGaN power semiconductor switches 19 are arranged as electronic components 3 has connecting elements 7 by means of which a further electrical module 18 is connectable with the first electronic module 2. This further electronic module 18 may for example take the form of an input or output module which, in addition to further unspecified electronic components, has input or output filters as electronic components 3.

FIG. 1 furthermore shows an enclosure chassis 5 of the electrical converter 1 which is plugged onto a rear wall plate 26 and an enclosure lid 6 of the electrical converter 1. This rear wall plate 26 may for example be part of the electrical converter 1 or part of a rear wall of a switchgear cabinet.

The first electronic module 2 may be jointly intermated together with the two further electronic modules 18 arranged on each side of the electronic module 2, wherein the direction arrows 22 pointing towards the electronic modules 2, 18 determine the directions of intermating of these electronic modules 2, 18.

These then intermated electronic modules 2, 18 may on the one hand be inserted and latched in the enclosure chassis 5 or on the other hand inserted and latched in the enclosure lid 6. FIG. 1 does not show the mating and latching of the intermated electronic modules 2, 18 in the enclosure chassis 5 or enclosure lid 6, wherein FIG. 2 and the FIG. 3 show a representation which is detailed in this respect of the example of the enclosure chassis 5.

If the intermated electronic modules 2, 18 are inserted into the enclosure chassis 5 in the direction of direction arrow 22, which points towards the enclosure lid 6, and latched in place there, the enclosure lid 6 may be mated via the enclosure chassis 5 and latched in place there (not shown in FIG. 1).

If the intermated electronic modules 2, 18 are inserted into the enclosure lid 6 in the direction of direction arrow 22, which points towards the enclosure lid 6, and latched in place there, the enclosure lid 6 may be inserted in the enclosure chassis 5 and latched in place there (not shown in FIG. 1).

Figure 2:
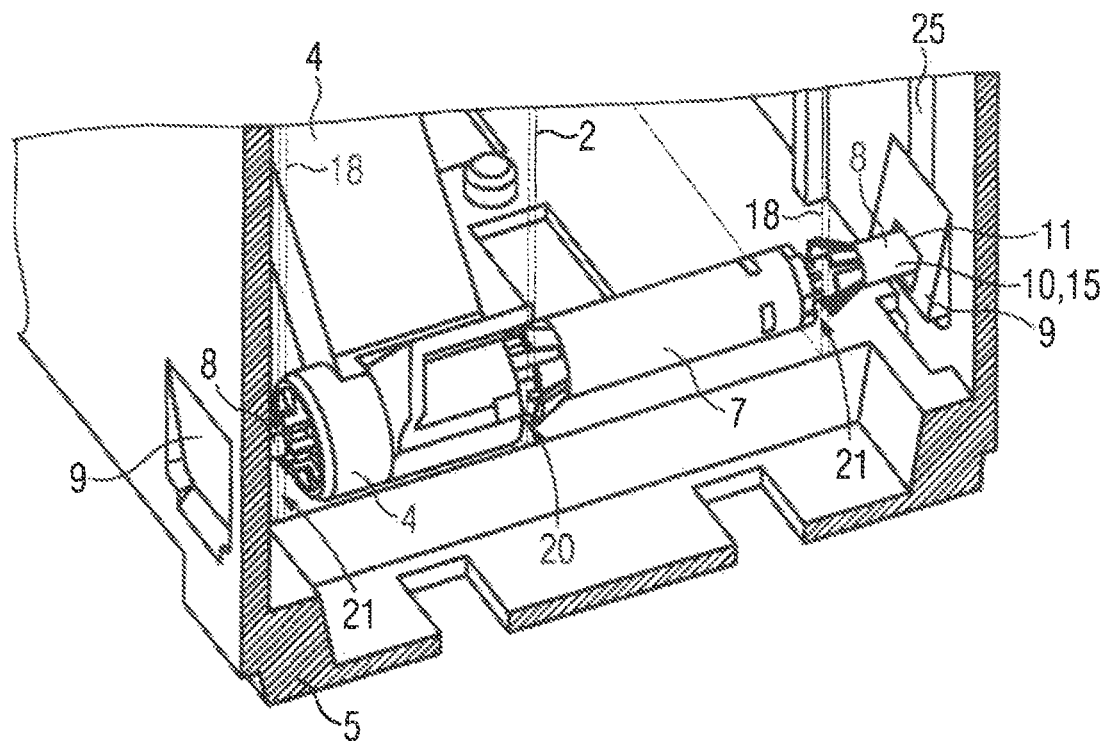
FIG. 2 shows a first schematic detail representation as an exemplary embodiment of the electrical converter according to the invention of FIG. 1.
Figure 3:
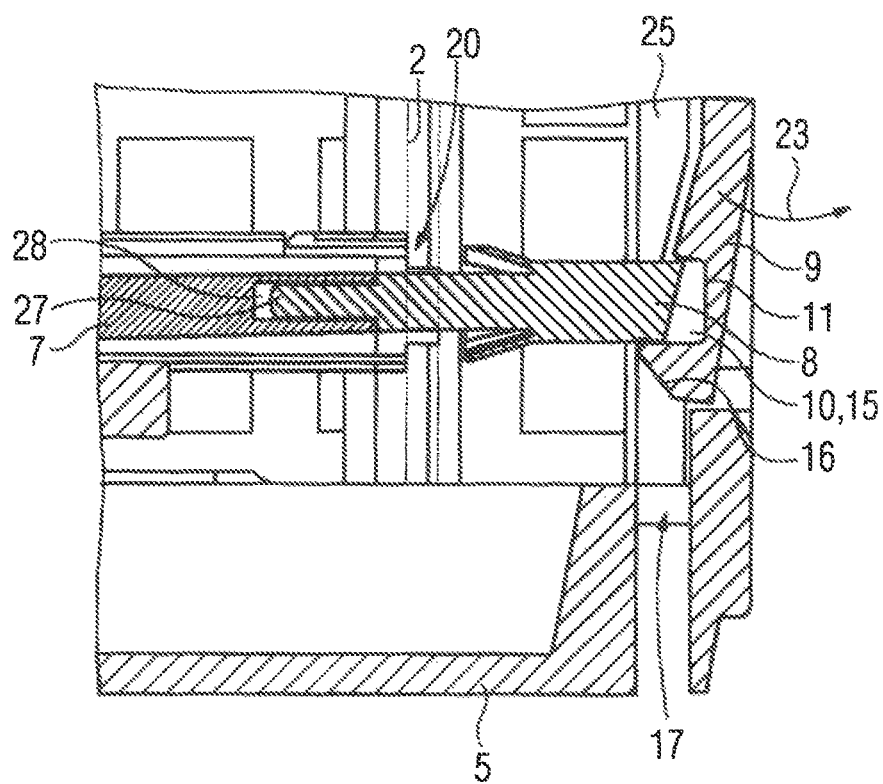
FIG. 3 shows a further schematic detail representation as an exemplary embodiment of the electrical converter according to the invention of FIG. 1.

FIG. 2 shows a first schematic detail representation as an exemplary embodiment of the electrical converter 1 according to the invention of FIG. 1.

The first electronic module 2 is mechanically mated to the module frame 4 at the installation location 20 by means of the connecting element 7. One of the further electronic modules 18 is directly mechanically mated by means of this connecting element 7 with the first electronic module 2 at an installation location 21 which is arranged on the side of the first electronic module 2 which is remote from the module frame 4.

The first electronic module 2 is mechanically mated with the module frame 4 at the installation location 20 via the module frame 4 by means of one of the connecting elements (not shown in FIG. 2) on the side of the first electronic module 2 facing the module frame 4.

Both of the further electronic modules 18 are mechanically mated and latched at their respective installation locations 21 by means of two further connecting elements 8 with in each case one of the latch elements 9 of the enclosure chassis 5.

The two further connecting elements 8 each have to this end a connecting head 10 (only one of the two connecting heads 10 is shown in FIG. 2), each of which has a cylindrical shape 15 and via which in each case a latch element indentation 11 of the latch elements 9 (only one of the two latch element indentations 11 is shown in FIG. 2) is mechanically mated and latched with the latch elements (9) of the enclosure chassis (5).

The connecting heads 10 (only one of the two connecting heads 10 is shown in FIG. 2) of the two further connecting elements 8 are guidable into the respective latch element indentation 11 of the latch elements 9 (only one of the two latch element indentations 11 is shown in FIG. 2) by means of two guide rails 25 (only one of the two guide rails 25 is shown in FIG. 2).

FIG. 3 shows a further schematic detail representation as an exemplary embodiment of the electrical converter 1 according to the invention of FIG. 1.

The first electronic module 2 at the installation location 20, which is mechanically mateable with the module frame by means of the connecting element 7 (the module frame is not shown in FIG. 3), is mechanically mated and latched with the enclosure chassis 5 by means of the connecting head 10 of the further connecting element 8 via the latch element indentation 11 of the latch element 9 of the enclosure chassis 5. The connecting head 10 has a cylindrical shape 15.

The connecting head 10 of the further connecting element 8 is guidable into the latch element indentation 11 of the latch element 9 by means of the guide rail 25.

FIG. 3 furthermore shows a mechanical connection of the connecting element 7 with the further connecting element 8, wherein the electronic module 2 is mechanically mated by means of the two connecting elements 7, 8.

The connecting element 7 has for this purpose a blind hole 27 into which a pin 28 of the further connecting element 8 is inserted.

A means 16 for unlatching is provided on the latch element 9, which means moves the latch element 9 in an unlatching movement direction 23 on application of force by a tool introduced into the opening 17 of the enclosure chassis 5, wherein the connecting head 10 of the further connecting element 8 can unlatch from the latch element indentation 11 of the latch element 9 and slide into the guide rail 25.

Figure 4:
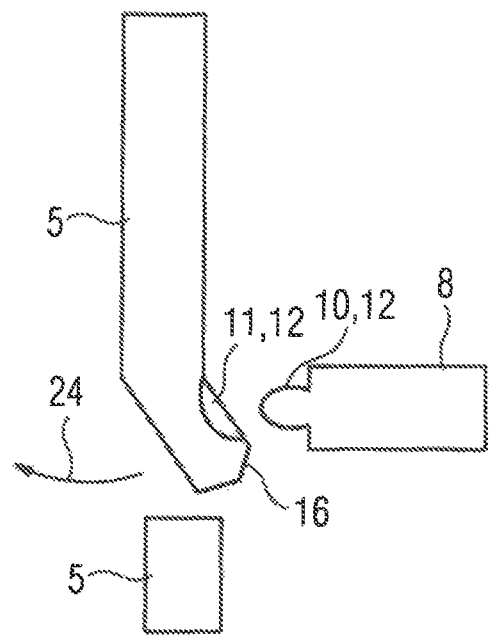
FIG. 4 shows a first schematic representation of an exemplary embodiment of a latch element of FIG. 2 or FIG. 3.

FIG. 4 shows a first schematic representation of an exemplary embodiment of a latch element indentation 11 of FIG. 2 or FIG. 3.

The enclosure chassis 5 has the latch element indentation 11 of the latch element, wherein the latch element indentation 11, like the connecting head 10 of the further connecting element 8, has a spherical shape 12. On application of force in a latching movement direction 24, the connecting head 10 can latch into the latch element indentation 11.

The connecting head 10 of the further connecting element 8 latched in the latch element indentation 11 of the latch element can be unlatched by application of force onto the unlatching means 16.

Figure 5:
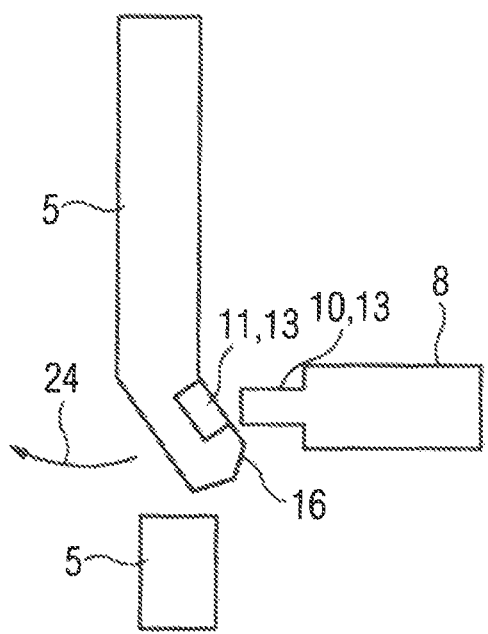
FIG. 5 shows a second schematic representation of an exemplary embodiment of a latch element of FIG. 2 or FIG. 3

FIG. 5 shows a second schematic representation of an exemplary embodiment of a latch element indentation 11 of FIG. 2 or FIG. 3.

The enclosure chassis 5 has the latch element indentation 11 of the latch element, wherein the latch element indentation 11, like the connecting head 10 of the further connecting element 8, has a rectangular shape 13. On application of force in a latching movement direction 24, the connecting head 10 can latch into the latch element indentation 11.

The connecting head 10 of the further connecting element 8 latched in the latch element indentation 11 of the latch element can be unlatched by application of force onto the unlatching means 16.

Figure 6:
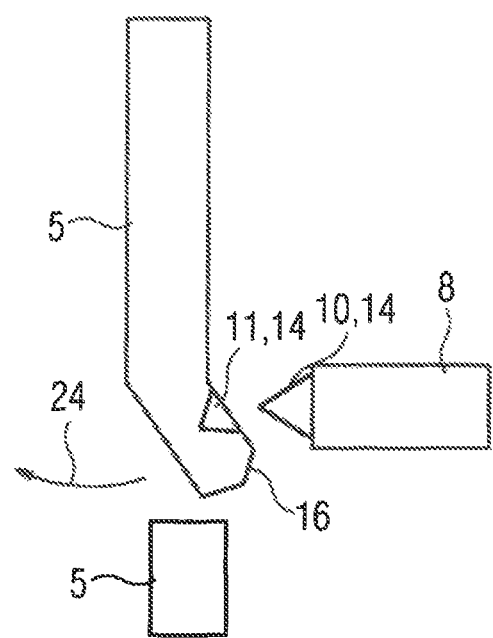
FIG. 6 shows a third schematic representation of an exemplary embodiment of a latch element of FIG. 2 or FIG. 3.

FIG. 6 shows a second schematic representation of an exemplary embodiment of a latch element indentation 11 of FIG. 2 or FIG. 3.

The enclosure chassis 5 has the latch element indentation 11 of the latch element, wherein the latch element indentation 11, like the connecting head 10 of the further connecting element 8, has a tapered shape 14. On application of force in a latching movement direction 24, the connecting head 10 can latch into the latch element indentation 11.

The connecting head 10 of the further connecting element 8 latched in the latch element indentation 11 of the latch element can be unlatched by application of force onto the unlatching means 16.

What is claimed is:

1. An electrical converter, comprising:
an enclosure chassis;
an enclosure lid;
a first electronic module including electronic components, at least one of the electronic components being a wide-bandgap GaN or InGaN power semiconductor switch having a blocking voltage of at least 400 V, a switching current of at least 7 A and a clock frequency of at least 40 kHz; and
a module frame formed from a non-metallic material coated with metal by vapor-deposition, or formed entirely from a non-metallic material, said module frame mechanically receiving and grouping electronic modules, said first electronic module being mechanically mated with the module frame by way of first connecting elements, with the mated first electronic module being mechanically mated and latched by second connecting elements to the enclosure chassis via latch dements arranged on the enclosure chassis or to the enclosure lid via latch dements arranged on the enclosure lid.

2. The electrical converter of claim 1, wherein the first electronic module is mechanically mated with at least one further electronic module comprising electronic components either directly by way of third connecting dements or indirectly via the module frame by way of the third connecting elements, or both.

3. The electrical converter of claim 2, wherein the at least one further electronic module is mechanically mated and latched by means of fourth connecting elements to the enclosure chassis via the latch elements arranged on the enclosure chassis or to the enclosure lid via the latch elements arranged on the enclosure lid.

4. The electrical converter of claim 3, wherein each of the fourth connecting elements has a connecting head which is inserted and latched into a latch element indentation of a respective one of the latch elements.

5. The electrical converter of claim 4, wherein
the connecting heads of the fourth connecting elements and the latch element indentation of the latch elements have an at least partially formed spherical shape, or the connecting heads of the fourth connecting elements and the latch element indentation of the latch elements have a rectangular shape, or the connecting heads of the fourth connecting elements and the latch element indentation of the latch elements have a tapered shape, or the connecting heads of the fourth connecting elements and the latch element indentation of the latch elements have a cylindrical shape.

6. The electrical converter of claim 3, wherein the first, third or fourth mechanical connecting elements are made from a nonmetallic material coated with metal by vapor-deposition, or wherein the first, third or fourth mechanical connecting elements are entirely made from a nonmetallic material.

7. The electrical converter of claim 6, wherein the nonmetallic material is a plastic material.

8. The electrical converter of claim 3, wherein mechanical connections formed by at least one of the first, second, third and fourth connecting elements are screwless mechanical connections.

9. The electrical converter of claim 4, wherein the enclosure chassis or the enclosure lid comprises at least one guide rail constructed to guide at least one of the connecting heads to the respective latch element indentations.

10. The electrical converter of claim 1, wherein the latch elements are constructed for mechanical movement either individually or jointly with the enclosure chassis or the enclosure lid, and wherein the latch elements have a release device for unlatching the respective other connecting element.

11. The electrical converter of claim 10, wherein the enclosure chassis or the enclosure lid, or both, has an opening for actuating the release device.

12. The electrical converter of claim 1, wherein the enclosure lid is mechanically connected and latched with the enclosure chassis.

13. The electrical converter of claim 12, wherein the mechanical connection of the enclosure lid to the enclosure chassis is a screwless mechanical connection.

14. The electrical converter of claim 1, wherein the nonmetallic material of the module frame is a plastic material.

15. The electrical converter of claim 1, wherein the enclosure chassis or the enclosure lid, or both, are made from a nonmetallic material coated with metal by vapor-deposition, or wherein the enclosure chassis or the enclosure lid is entirely made from a nonmetallic material.

16. The electrical converter of claim 15, wherein the nonmetallic material is a plastic material.

* * * * *